United States Patent [19]

Fujii et al.

[11] Patent Number: 5,017,505
[45] Date of Patent: May 21, 1991

[54] METHOD OF MAKING A NONVOLATILE SEMICONDUCTOR MEMORY APPARATUS WITH A FLOATING GATE

[75] Inventors: Tetsuo Fujii, Toyohashi; Toshio Sakakibara, Nishio; Nobuyoshi Sakakibara, Hekinan, all of Japan

[73] Assignee: Nippondenso Co., Ltd., Kariya, Japan

[21] Appl. No.: 313,898

[22] Filed: Feb. 23, 1989

Related U.S. Application Data

[63] Continuation of Ser. No. 210,509, Jun. 23, 1988, abandoned, which is a continuation of Ser. No. 887,062, Jul. 18, 1986, abandoned.

[51] Int. Cl.$^5$ ............................................. H01L 21/70
[52] U.S. Cl. ................................. 437/52; 437/43; 437/51; 437/193; 437/195; 437/228; 437/233; 437/235
[58] Field of Search .................... 437/43, 51, 52, 193, 437/195, 228, 233, 235; 357/23.5, 40; 365/185, 186

[56] References Cited

U.S. PATENT DOCUMENTS

| | | | |
|---|---|---|---|
| 4,099,196 | 7/1978 | Simka | 357/23.5 |
| 4,185,319 | 1/1980 | Stewart | 357/23.5 |
| 4,404,577 | 9/1983 | Cranford | 357/23.5 |
| 4,441,249 | 4/1984 | Alspector . | |
| 4,460,416 | 7/1984 | Wansanicz . | |
| 4,511,800 | 4/1985 | Harbeke | 250/372 |
| 4,577,390 | 3/1986 | Haken . | |
| 4,597,159 | 7/1986 | Usami | 148/DIG. 138 |

OTHER PUBLICATIONS

Anderson et al., J. Appl Phys, Nov. 1977, pp. 4834-4836.
Huff et al., J. Electrochem Soc, Nov. '80, pp. 2482-2488.
Ghandhi, VLSI Fabrication Principles, 1983, pp. 432-435, 388-391.
Chiao, "Developments in ... Memories", Semiconductor International, 4/85, pp. 156-159.

Primary Examiner—Olik Chaudhuri
Assistant Examiner—Tom Thomas
Attorney, Agent, or Firm—Cushman, Darby & Cushman

[57] ABSTRACT

A first polysilicon film serving as an erase gate is deposited on the major surface of a semiconductor substrate on which a field oxide film is formed, so that the surface of the first polysilicon film is roughened. The surface of the first polysilicon film is thermally oxidized to form a first thermal oxide film thereon. During the oxidation, the roughened surface of the first polysilicon film is flattened, and is duplicated by the surface of the first thermal oxide film. A second polysilicon film is deposited on the roughened surface of the first thermal oxide film. The back surface of the second polysilicon film is roughened by the roughened surface of the first thermal oxide film. In this case, the surface of the second polysilicon film is also roughened. The roughened surface of the second polysilicon film is thermally oxidized in the same manner as described above to flatten its surface and to form a second thermal oxide film, the surface of which is roughened. A third polysilicon film serving as a write gate is formed on the second thermal oxide film.

23 Claims, 5 Drawing Sheets

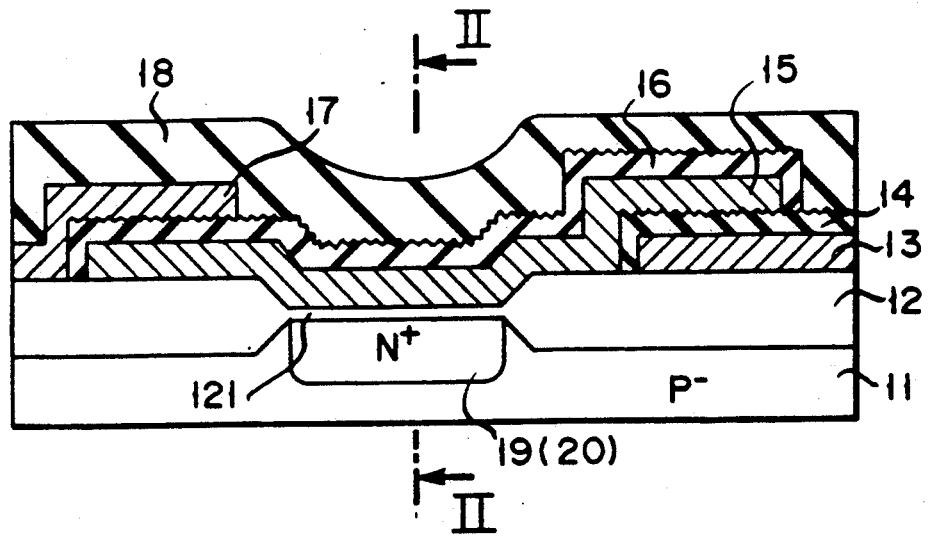
F I G. 1
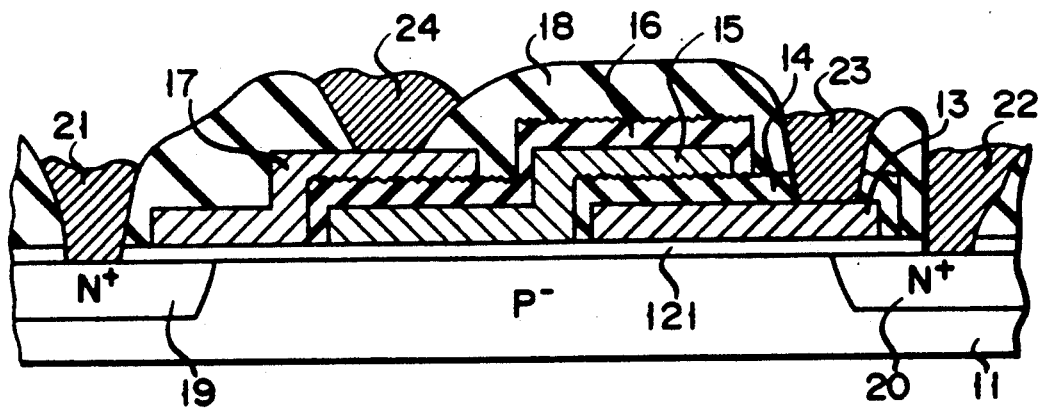
F I G. 2
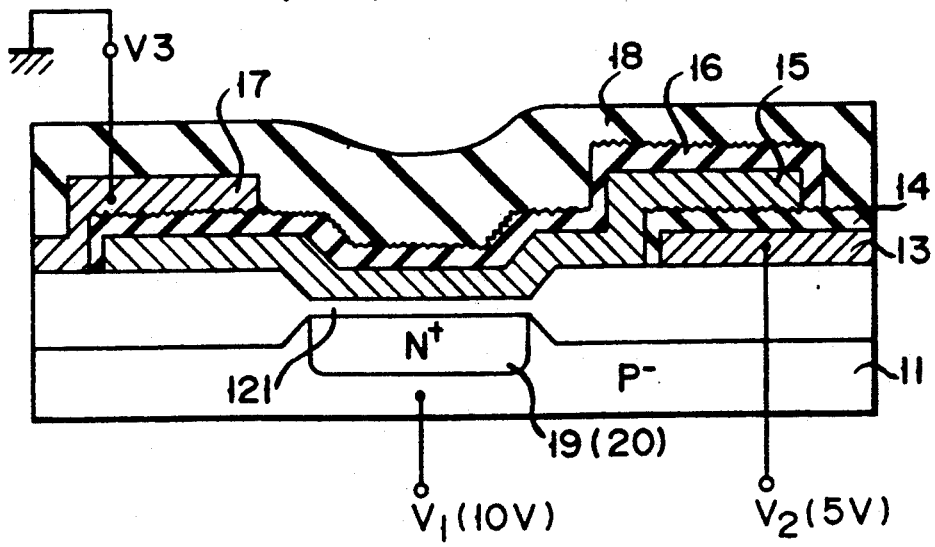
F I G. 3

1μm

METHOD OF MAKING A NONVOLATILE SEMICONDUCTOR MEMORY APPARATUS WITH A FLOATING GATE

This is a continuation of application Ser. No. 07/210,509, filed June 23, 1988 now abandoned;

BACKGROUND OF THE INVENTION

The present invention relates to a nonvolatile semiconductor memory apparatus capable of writing and erasing data and a method of manufacturing it and, more particularly, to a nonvolatile semiconductor memory apparatus in which a tunnel current flows through an insulating film comprising a relatively thick (400 to 2,000 angstroms) oxide film and charges are injected into a floating gate to write or erase data utilizing a phenomenon wherein an electric field tends to be concentrated on a roughened portion formed on the surface of a polycrystalline silicon (polysilicon) film, and a method of manufacturing it.

In the manufacture of a nonvolatile memory apparatus, when a polysilicon film to be used as a floating gate or a writing gate is formed, a roughened portion is formed on the surface of the polysilicon film. This is done to prepare a nonvolatile memory, i.e., an EEPROM. In such a memory, a predetermined voltage is applied to the polysilicon film portion to cause an electric field concentration phenomenon on the roughened portion, and even when a relatively thick (e.g., 800 angstroms) oxide film is formed as an electron discharge source, a tunnel current is flowed through the oxide film to electrically control erase and write operations.

However, in order to control the shape of the roughened portion on the surface of the polysilicon film, deposition conditions (e.g., a deposition temperature, a deposition rate, and the like) must be optimally set during a polysilicon deposition step. In addition, when oxidation conditions (e.g., an oxidation temperature, an oxidation atmosphere, and the like) are set during an oxidation step following the deposition step, a strict control operation is necessary. Therefore, when the roughened portion is formed on the surface of the polysilicon film, it is difficult to control its shape, and the resultant roughened shape often does not correspond to the target shape, thus impairing the reliability of the semiconductor memory apparatus.

SUMMARY OF THE INVENTION

It is an object of the present invention to provide a nonvolatile semiconductor memory apparatus in which charges are injected into a floating gate upon use of electric field concentration on a roughened portion formed on the surface of a polysilicon film, and a method of manufacturing it.

It is another object of the present invention to provide a highly reliable, nonvolatile semiconductor memory apparatus in which a roughened portion for concentrating an electric field thereon can be formed during a deposition step of a polysilicon film, without intentionally forming it on the surface of the polysilicon film, and a method of manufacturing it.

It is still another object of the present invention to provide a semiconductor memory apparatus which can effectively use a roughened portion on the surface of a polysilicon film after the deposition step thereof, and a method of manufacturing it.

With the nonvolatile semiconductor memory apparatus according to the present invention, a roughened portion is not intentionally formed on the polysilicon film after the surface of the polysilicon film is oxidized, but a roughened portion formed immediately after the deposition step of the polysilicon film is utilized. The shape of this roughened portion is determined only by deposition conditions of the polysilicon film, and can be relatively easily controlled with high precision. When the thus deposited polysilicon film is thermally oxidized at a temperature higher than the predetermined temperature, the shape of the roughened portion formed on the surface of the polysilicon film can be duplicated by thermally oxidizing a film formed during a thermal oxidation step. The present inventors found that the surface of the polysilicon film is recrystallized to be substantially flattened, thus preventing an electric field concentration phenomenon on this portion.

A new polysilicon film is formed on the surface of the thermal oxide film on which the roughened portion is formed. The surface portion of the new polysilicon film, which is in contact with the thermal oxide film, duplicates the roughened shape of the surface of the thermal oxide film. In this way, the roughened portion for concentrating the electric field can be formed on the surface of the new polysilicon film.

More specifically, the roughened portion formed during the deposition step of the first polysilicon film can be duplicated by the new polysilicon film. Therefore, it is easy to obtain a structure which can easily concentrate an electric field only on the roughened portion of the new polysilicon film, so that unidirectional electrons or charges easily flow.

BRIEF DESCRIPTION OF THE DRAWINGS

FIG. 1 is a sectional view of one memory section of a nonvolatile semiconductor memory apparatus according to an embodiment of the present invention;

FIG. 2 is a sectional view taken along line II—II in FIG. 1;

FIGS. 3 and 4 are sectional views for respectively explaining the write and erase operations in the semiconductor memory apparatus shown in FIG. 1;

DETAILED DESCRIPTION OF THE PREFERRED EMBODIMENT

Figure 4:
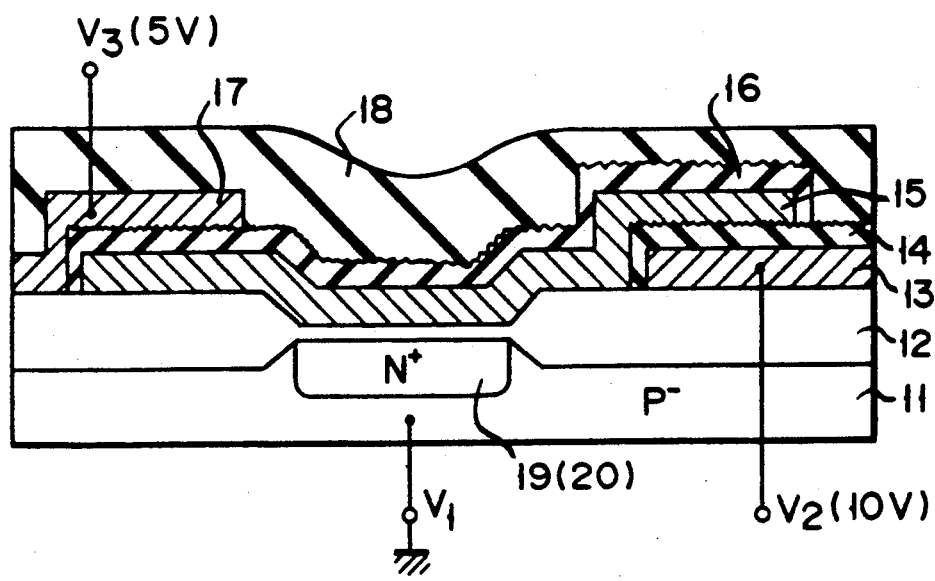

A nonvolatile semiconductor memory apparatus of the present invention comprises, e.g., an EPROM or an EEPROM. In this embodiment, the EEPROM will be exemplified. FIGS. 1 and 2 show a memory cell portion of the EEPROM, and exemplify a structure where a write gate for the memory cell is formed on a semiconductor substrate. Of course, the present invention can be applied to a semiconductor apparatus of a structure which uses a breakdown phenomenon inside the semiconductor substrate or channel hot electrons as a write means.

In this memory apparatus, semiconductor substrate 11 comprises a p$^-$-type silicon substrate having a resistivity of 5 to 20 Ω·cm and orientation of (100). 1.0 μm thick field oxide film 12 is formed on the surface of substrate 11 using a selective oxidation technique. First polysilicon film 13 serving as an erase gate is formed on the surface portion of field oxide film 12, and first thermal oxide film 14 is formed on film 13. Second polysilicon film 15 serving as a floating gate is deposited on a portion of film 14 and on film 12.

Second thermal oxide film 16 is formed on the surface of film 15, and third polysilicon film 17 serving as an electron injection gate is selectively formed on a portion of film 16 and on film 12. Reference numeral 18 denotes an insulating protective film of silicon oxide (SiO$_2$) formed by the CVD method.

In field oxide film 12, portion 121 corresponding to n$^+$-type source region 19 and drain region 20 of a MOS transistor formed on semiconductor substrate 11 is formed to be thin. Contact electrodes 21 and 22 are formed on the surface portions of substrate 11 to correspond to source and drain regions 19 and 20. In addition, erase electrode 23 is formed to correspond to first polysilicon film 13, and charge injection gate electrode 24 is formed to correspond to third polysilicon film 17. Note that in FIGS. 1 and 2, metal wiring layers are omitted.

The surfaces of first and second thermal oxide films 14 and 16 are roughened, as shown in FIGS. 1 and 2. The roughened portions are formed by duplicating the roughened portions formed on the surfaces of polysilicon films 13 and 15 when they are deposited. In this way, since second and third polysilicon films 15 and 17 are formed on first and second thermal oxide films 14 and 16 having the roughened portions, respectively, roughened portions corresponding to those formed on oxide films 14 and 16 are respectively formed on the back surface portions of films 15 and 17.

During write and erase operations performed by injecting electrons to second polysilicon film 15 serving as the floating gate, sufficient electric field concentration occurs on the roughened surface portions formed on the back surface portions of films 17 and 15. Therefore, even if a relatively thick oxide film is formed, the write and erase operations are enabled.

In contrast to this, the surface portions of films 13 and 15 are substantially flattened. For this reason, almost no electric field concentration occurs on the surface portions of films 13 and 15, and electrons flow in a reverse direction.

FIG. 3 shows a write operation state of the EEPROM. In the write mode shown in FIG. 3, third polysilicon film 17 serving as the electron injection gate is connected to a ground potential (V3=0), and semiconductor substrate 11 is connected to a high potential e.g., V1=10 V). First polysilicon film 13 serving as the erase gate is connected to a medium potential (e.g., V2=5 V). More specifically, the relation V1>V2>V3 is obtained, and the electric field is concentrated on the roughened portions of third polysilicon film 17, so that electrons are injected to the second polysilicon film 15 side serving as the floating gate, thus allowing the charge write operation.

FIG. 4 shows an erase operation state of the EEPROM. In the erase mode, third polysilicon film 17 is connected to a medium potential (e.g., V3=5 V), and semiconductor substrate 11 is connected to a ground potential (V1=0). In addition, first polysilicon film 13 is connected to a high potential (e.g., V2=10 V). Thus, the relation V2>V3>V1 is obtained, so that the electric field is concentrated on the roughened portions of second polysilicon film 15. In this state, electrons flow to the first polysilicon film 13 side, and the charges held therein are erased.

Figure 5A:
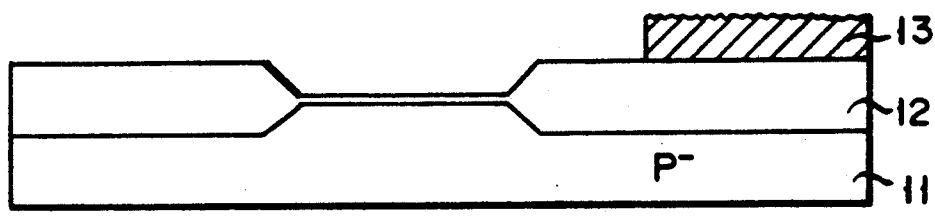
FIGS. 5A to 5D are sectional views for sequentially explaining the steps in the manufacture of the semiconductor memory apparatus shown in FIG. 1.

The method of manufacturing this nonvolatile semiconductor memory apparatus will now be described. First, as shown in FIG. 5A, 1.0 μm thick field oxide film 12 is formed on the surface of p$^-$-type silicon substrate 11 using a selective oxidation technique. Then, a polysilicon film is deposited by the LPCVD method on the entire surface of substrate 11, not at high temperature but in an atmosphere at a temperature of, preferably, 550° to 650° C. (in this embodiment, 610° C) under the flow of silane (SiH$_4$) gas and phosphine (PH$_3$) gas. This is to prevent crystal particles in the deposited polysilicon film from being recrystallized and grown during the deposition. In addition, this is to maintain the roughened portions formed on the surface of the polysilicon film during the deposition as much as possible.

The deposited polysilicon film is selectively etched using a predetermined pattern to form first polysilicon film 13.

Figure 6:
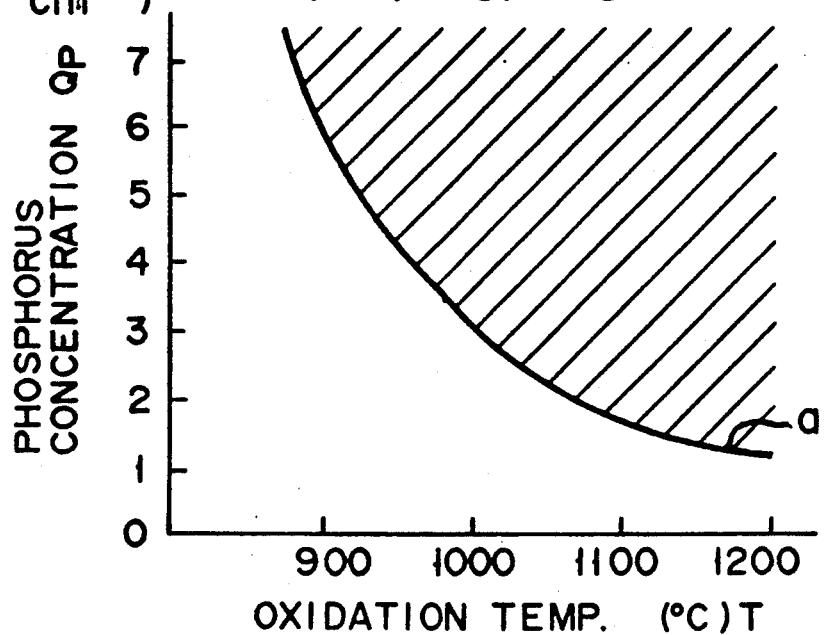
FIG. 6 is a graph showing conditions for flattening the surface of a polysilicon film after thermal oxidation in the manufacture of the semiconductor memory apparatus.

Note that the phosphorus concentration in polysilicon film 13 is $1 \times 10^{20}$ to $7 \times 10^{20}$ cm$^{-3}$, and is preferably $3 \times 10^{20}$ to $6 \times 10^{20}$ cm$^{-3}$ taking the oxidation temperature into consideration (FIG. 6). The shape of the roughened portions formed on the surface of the deposited polysilicon film can be accurately determined under the above-mentioned temperature control.

Figure 5B:
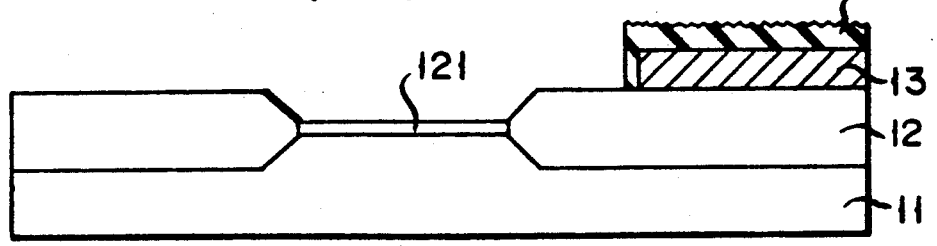

After first polysilicon film 13 is formed, the thin portion of oxide film 12 except for the field portion is removed by etching to locally expose the surface of substrate 11. Then, oxidation is performed in an atmosphere of dry O$_2$ gas or the same containing HCl at a temperature of 900° to 1,300° C. and, preferably, 1,000° to 1,200° C., so that new oxide film 121 of a thickness of 400 to 1,500 angstroms is formed as shown in FIG. 5B. In this case, oxidation can be performed by a heating means (e.g., a halogen lamp) using a quick oxidation technique for ten seconds to several minutes within a temperature range of 1,150° to 1,300° C.

In this way, first thermal oxide film 14 is formed on the surface of first polysilicon film 13. First thermal oxide film 14 duplicates the surface state (roughened state) formed when polysilicon for film 13 is deposited. The roughened portion is formed on the surface of thermal oxide film 14. However, it was found that the surface of polysilicon film 13 is virtually flattened since re-crystallization of polysilicon occurs during the thermal oxidation to increase the crystal particle size.

From the test results of the present inventors, as shown in FIG. 6, the surface flattening phenomenon of first polysilicon film 13 was observed in a hatched region above the boundary indicated by characteristic curve a, using phosphorus concentration Qp and oxidation temperature T as parameters.

Conditions for causing the surface flattening phenomenon were found to be as follows. The phosphorus concentration in the polysilicon film must fall within the range of $1 \times 10^{20}$ to $7 \times 10^{20}$ cm$^{-3}$ and, preferably, $3 \times 10^{20}$ to $6 \times 10^{20}$ cm$^{-3}$, and the oxidation temperature must fall within the range of 900° to 1,300° C. and, preferably 1,000° to 1,200° C.

Figure 7:
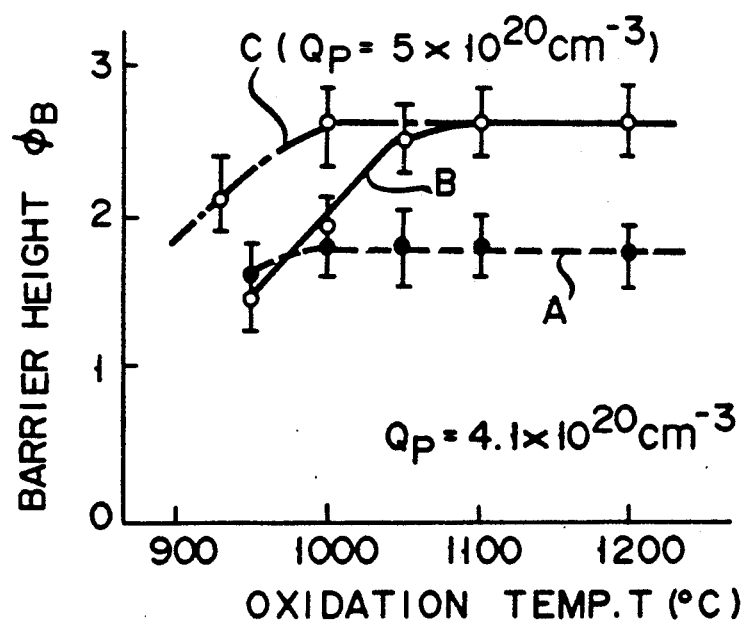
FIG. 7 is a graph showing the relationship between oxidation temperature T and effective barrier height in relation to a given phosphorus concentration in a specific polysilicon film.

A determination method of the boundary indicated by characteristic curve a in FIG. 6 will be explained with reference to FIG. 7. FIG. 7 exemplifies the relationship between oxidation temperature T and effective barrier height $\phi B$ when the phosphorus concentrations in the polysilicon film are $4.1 \times 10^{20}$ cm$^{-3}$ and $5 \times 10^{20}$ cm$^{-3}$.

Figure 8A:
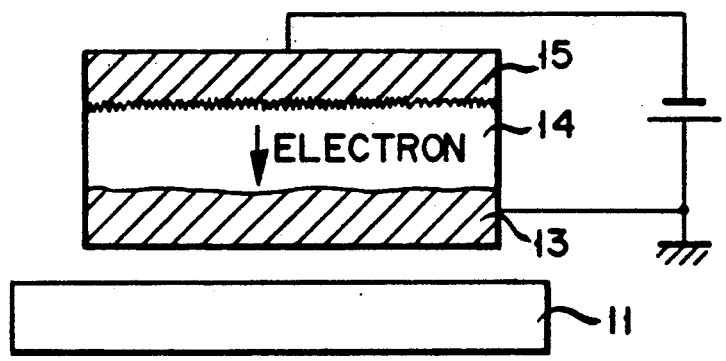
FIGS. 8A and 8B are diagrams for explaining electron injection conditions corresponding to characteristics A and B shown in FIG. 7.
Figure 8B:
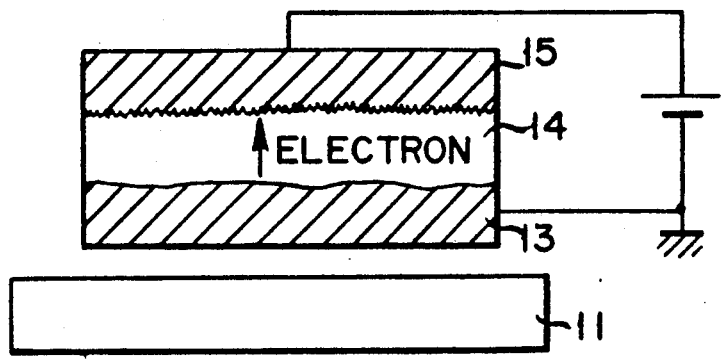

Note that barrier height $\phi B$ indicates the level of an effective energy barrier between the polysilicon film and the insulating film, i.e., difficulty of injection when electrons or charges are injected from one polysilicon film to the other polysilicon film through the insulating film, as shown in FIGS. 8A and 8B. This also serves as a parameter indicating the level of electric field concentration on the polysilicon film surface, i.e., the flatness of the film surface.

Characteristic curve A in FIG. 7 indicates the difficulty of electron injection from second polysilicon film 15 having the roughened portion to first polysilicon film 13 through first thermal oxide film 14, as shown in FIG. 8A. Characteristic curve B indicates the difficulty of electron injection from first polysilicon film 13 to second polysilicon film 15 through thermal oxide film 14, as shown in FIG. 8B.

As can be seen from FIG. 7, in the state indicated by characteristic curve A, even if the oxidation temperature varied widely (in this case, within the range of 1,000° to 1,200° C.), barrier height $\phi B$ was stable. From another test result, even if phosphorus concentration in the polysilicon film was changed, substantially uniform barrier height $\phi B$ could be obtained.

In contrast to this, in the state indicated by characteristic curve B, when oxidation temperature T was below 1,100° C., barrier height $\phi B$ was gradually decreased. However, when phosphorus concentration Qp was increased, as indicated by characteristic curve C, stable barrier height $\phi B$ could be obtained at lower oxidation temperature T (in this case, about 1,000° C.).

In order to improve the electron (or charge) write and erase characteristics of the above-mentioned semiconductor apparatus, a difference between characteristic curves A and B respectively corresponding to the write and erase operations shown in FIG. 7 is preferably increased and, more preferably, difference $\Delta\phi B$ exceeds 0.5.

Note that oxidation temperature T exceeding 1,300° C. is undesirable since high-precision control is difficult. When phosphorus concentration Qp is set below $1 \times 10^{20}$ cm$^{-3}$, the surface flattening phenomenon is interfered therewith, as shown in FIG. 6. When phosphorus concentration Qp exceeds $7 \times 10^{20}$ cm$^{-3}$, a large amount of phosphorus enters the insulating film, thus degrading the film quality and changing its characteristics.

Figure 9A:
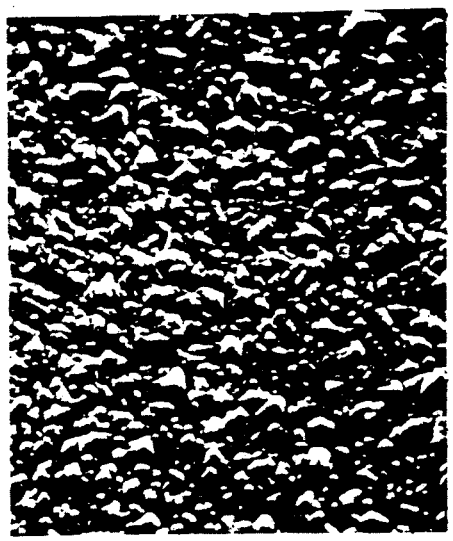
FIGS. 9A to 9C are photographs showing the roughened surface state of the polysilicon film in the manufacture of the semiconductor memory apparatus according to the present invention.
Figure 9B:
Figure 9C:

FIGS. 9A to 9C are photographs showing the surface conditions of first polysilicon film 13. FIG. 9A shows the surface condition of film 13 immediately after polysilicon deposition. FIG. 9B shows the surface condition of thermal oxide film 14 after film 14 is formed on the surface of film 13. In FIG. 9B, the roughened shape of film 13 shown in FIG. 9A is duplicated by the surface of film 14. FIG. 9C shows the surface condition of film 13 after film 14 is formed. After film 14 is formed, the surface of film 13 is flattened.

More specifically, the surface shape of film 13 immediately after polysilicon deposition and that of film 14 represent substantially the same roughened shape (particle shape). In contrast to this, the surface of film 13 after film 14 is formed has an increased crystal particle size and is thereby sufficiently flattened.

Figure 5C:
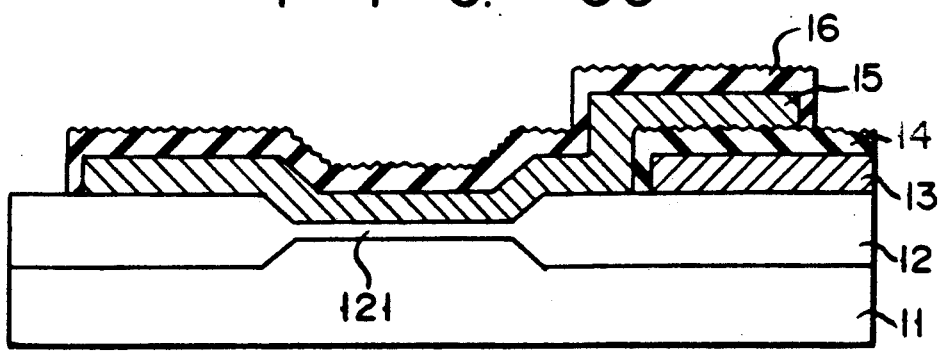
Figure 5D:
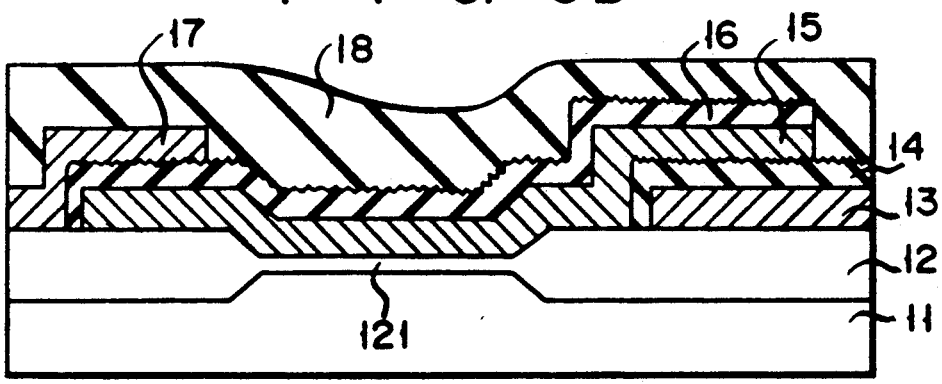

Next, as shown in FIG. 5C, second polysilicon film 15 is selectively formed on oxide films 121 and 12 and on a portion of first thermal oxide film 14. The resultant structure is then oxidized to form second thermal oxide film 16 on film 15. As shown in FIG. 5D, third polysilicon film 17 is then selectively formed on field oxide film 12 and on a portion of second thermal oxide film 16. Thereafter, insulating film 18 of, e.g., CVD-SiO$_2$ is formed on the entire surface of the substrate as the insulating protective film.

Note that in the above descriptions, the source and drain regions of a MOS transistor, metal wiring layers, electrode contact portions, and the like are omitted for the sake of simplicity.

In the above embodiment, phosphorus is doped in polysilicon. However, an impurity doped in polysilicon is not limited to phosphorus, but can also be arsenic. During polysilicon deposition, phosphorus is doped in the polysilicon film under the flow of phosphine (PH$_3$) gas. Alternatively, after a non-doped polysilicon film with a given roughened surface is deposited, an impurity (e.g., phosphorus) can be doped in the polysilicon film by ion-implantation.

In the above embodiment, charge injection and erase gates are formed of polysilicon. However, they can comprise amorphous materials (e.g., silicides, high-melting point metals, and the like).

As set out above, first and second polysilicon films 13 and 15 are deposited by the low-pressure CVD method in a temperature atmosphere of 550° to 650° C. That is, the deposited polysilicon is crystallized with this surface roughened. However, the means for forming the rough-surfaced polysilicon film is not restricted to the aforementioned polysilicon film depositing means using such a temperature atmosphere. The polysilicon film may also be deposited by the following method.

That is, an amorphous silicon film (a film in the amorphous state) is formed, while flowing a phosphine in a lower-temperature atmosphere of about 530° to 560° C., to obtain a phosphorus concentration of about "$4 \times 10^{20}$" in which case a smooth silicon film surface is obtained. This smooth-surfaced polysilicon film is plasma-etched in a CF$_4$ gas dominant atmosphere for a brief period of time to the extent of, for example, several tens to several hundreds of angstroms to obtain a rough-surfaced polysilicon film. Thereafter, the thermal oxidation step may be performed in the same way as mentioned above to obtain first and second rough-surfaced thermal oxide films 14 and 15.

Where such polysilicon film is to be formed by the low-pressure CVD method, an amorphous polysilicon is deposited in the temperature atmosphere of 530° to 560° C. to obtain a smooth surface. In an atmosphere ranging from that temperature to below about 650° C. a greater number of roughened portions are formed on the resultant surface of a deposited polysilicon film due to the crystallization of silicon. In an atmosphere of above 650° C., polysilicon crystals thus deposited have a large diameter, and the layer of polysilicon has a gently curving surface.

What is claimed is:

1. A method of manufacturing a semiconductor memory apparatus including an erase gate and a floating gate, comprising the steps of:
    (a) forming a first polysilicon film, as an erase gate, so that the surface of the first polysilicon film is rough;
    (b) thermally treating said first polysilicon film in an oxidation atmosphere at a temperature of 900° to 1,300° C. to form an oxide film on said rough surface of said first polysilicon film, such that the roughness of the surface of said first polysilicon film in step (a) is substantially duplicated on the surface of the oxide film and such that the surface of said first polysilicon film is substantially flattened; and
    (c) forming a second polysilicon film, as the floating gate, on at least a portion of the rough surface of said oxide film such that the surface of said second polysilicon film contacting said portion of the oxide film is deposited with a roughness corresponding to the roughness of said surface of said oxide film;
    wherein said first polysilicon film comprises polysilicon containing an impurity in the group of phosphorus and arsenic in a concentration of $1 \times 10^{20}$ to $7 \times 10^{20}$ atoms/cm$^{-3}$.

2. The method of claim 1, wherein step (a) involves low-pressure CVD deposition of the first polysilicon film at a temperature of 550° to 650° C.

3. The method of claim 1, wherein step (a) comprises the steps of:
    forming a smooth amorphous silicon film; and
    plasma etching said smooth film to obtain a rough-surfaced polysilicon film.

4. The method of claim 1, wherein step (b) is performed in an atmosphere of dry $O_2$ containing HCl and wherein said oxide layer is 400 to 1500 angstroms thick.

5. A method of manufacturing a semiconductor memory apparatus including a floating gate and an injection gate, comprising the steps of:
    (a) forming a first polysilicon film, as the floating gate, so that the surface of the first polysilicon film is rough;
    (b) thermally treating said first polysilicon film in an oxidation atmosphere at a temperature of 900° to 1,300° C. to form an oxide film on said rough surface of said first polysilicon film, such that the roughness of the surface of said first polysilicon film in step (a) is substantially duplicated on the surface of the oxide film and such that the surface of said first polysilicon film is substantially flattened; and
    (c) forming a second polysilicon film, as the injection gate, on at least a portion of the rough surface of said oxide film such that the surface of said second polysilicon film contacting said portion of the oxide film is deposited with a roughness corresponding to the roughness of said surface of said oxide film;
    wherein said first polysilicon film comprises polysilicon containing an impurity in the group of phosphorus and arsenic in a concentration of $1 \times 10^{20}$ to $7 \times 10^{20}$ atoms/cm$^{-3}$.

6. The method of claim 5, wherein step (a) involves low-pressure CVD deposition of the first polysilicon film at a temperature of 550° to 650° C.

7. The method of claim 5, wherein step (a) comprises the steps of:
    forming a smooth amorphous silicon film; and
    plasma etching said smooth film to obtain a rough-surfaced polysilicon film.

8. The method of claim 5, wherein step (b) is performed in an atmosphere of dry $O_2$ containing HCl and wherein said oxide layer is 400 to 1500 angstroms thick.

9. A method of manufacturing a nonvolatile semiconductor memory apparatus capable of writing and erasing data, comprising the steps of:
    forming a first polysilicon film, as a first gate, on the surface of a semiconductor substrate so that the surface thereof is rough;
    thermally treating said first polysilicon film formed in the previous step in an oxidation atmosphere at a temperature of 900° to 1,300° C., to form a first thermal oxide film on the surface of said first polysilicon film, such that the surface of said first polysilicon film is flattened and the surface of said first thermal oxide film is roughened in accordance with the roughness of the surface of said first polysilicon film;
    forming a second polysilicon film, as a second gate which functions as a floating gate, on at least a portion of the surface of said first thermal oxide film, such that a back surface portion of said second polysilicon film contacting said first thermal oxide film is deposited rough in accordance with the roughness of the surface of said first thermal oxide film;
    thermally treating the surface of said second polysilicon film in an oxidation atmosphere at a temperature of 900° to 1,300° C., to form a second thermal oxide film on the surface of said second polysilicon film, such that the surface of said second polysilicon film is flattened and the surface of said second thermal oxide film is roughened in accordance with the roughness of the surface of said second polysilicon film;
    forming a third polysilicon film, as a third gate, on said second thermal oxide film, such that a back surface portion of said third polysilicon film having roughness corresponding to that of the surface of said second thermal oxide film faces the surface of said second polysilicon film; and
    wherein said first to third polysilicon films comprise polysilicon containing an impurity, and an impurity concentration thereof falls within the range of $1 \times 10^{20}$ to $7 \times 10^{20}$ atoms cm$^{-3}$.

10. A method according to claim 9, wherein the impurity concentration of said first to third polysilicon films preferably falls within the range of $3 \times 10^{20}$ to $6 \times 10^{20}$ cm$^{-3}$.

11. A method according to claim 9, wherein the impurity contained in the polysilicon constituting said first to third polysilicon films is phosphorus.

12. A method according to claim 9, wherein the impurity contained in the polysilicon constituting said first to third polysilicon films is arsenic.

13. A method according to claim 9, wherein the steps of forming said first to third polysilicon films are achieved by means for growing polysilicon on said thermal oxide films respectively in a low-temperature atmosphere.

14. A method according to claim 13, wherein the temperature of the atmosphere for growth falls within the range of 550° to 650° C.

15. A method according to claim 14, wherein said first to third polysilicon films are formed by a low-pressure CVD method.

16. A method according to claim 9, wherein the thermal oxidation temperature preferably falls within the range of 1,000° to 1,200° C.

17. A method according to claim 9, wherein said first and second thermal oxide films are formed by oxidation in a dry oxygen atmosphere.

18. A method according to claim 9, wherein said first and second thermal oxide films are formed by oxidation in an atmosphere of a dry oxygen gas containing chlorine.

19. A method of manufacturing a nonvolatile semiconductor memory apparatus capable of writing and erasing data, comprising the steps of:

forming a first polysilicon film, as a first gate, so that the surface thereof is rough, by depositing polysilicon containing phosphorus as an impurity having a concentration of $1 \times 10^{20}$ to $7 \times 10^{20}$ atoms/cm$^{-3}$, on the surface of a semiconductor substrate by a low-pressure CVD method in a low temperature atmosphere falling within a range of 550° to 650° C.;

thermally treating said first polysilicon film in an oxidation atmosphere of a dry oxygen gas at a temperature of 900° to 1,300° C., to form a first thermal oxide film on the surface of said first polysilicon film, such that the surface of said first polysilicon film is flattened and the surface of said first thermal oxide film is roughened in accordance with the roughness of the surface of said first polysilicon film;

forming a second polysilicon film, as a second gate which functions as a floating gate, by depositing polysilicon containing phosphorus as an impurity having a concentration of $1 \times 10^{20}$ to $7 \times 10^{20}$ atoms/cm$^{-3}$, on at least a portion of the surface of said first thermal oxide film by a low-pressure CVD method in a low-temperature atmosphere falling within a range of 550° to 650° C., such that a back surface portion of said second polysilicon film contacting said first thermal oxide film is roughened in accordance with the roughness of the surface of said first thermal oxide film and the surface of said second polysilicon film is roughened;

thermally treating said second polysilicon film in an oxidation atmosphere of a dry oxygen gas at a temperature of 900° to 1,300° C., to form a second thermal oxide film on the surface of said second polysilicon film, such that the surface of said second polysilicon film is flattened and the surface of said second thermal oxide film is roughened in accordance with the roughness of the surface of said second polysilicon film; and forming a third polysilicon film, as a third gate, by depositing polysilicon containing phosphorus as an impurity having a concentration of $1 \times 10^{20}$ to $7 \times 10^{20}$ atoms/cm$^{-3}$, on said second thermal oxide film by a low-pressure CVD method in a low-temperature temperature falling within a range of 550° to 650°, such that a back surface portion of said third polysilicon film having roughness corresponding to that of the surface of said second thermal oxide film faces the surface of said second polysilicon film.

20. A method according to claim 19, wherein the impurity concentration of said first to third polysilicon films preferably falls within a range of $3 \times 10^{20}$ to $6 \times 10^{20}$ atoms/cm$^{-3}$.

21. A method according to claim 19, wherein the thermal oxidation temperature preferably falls within a range of 1,000° to 1,200° C.

22. A method according to claim 19, wherein said first and second thermal oxide films are formed by oxidation in an atmosphere of a dry oxygen gas containing chlorine.

23. A method according to claim 20, wherein the thermal oxidation temperature preferably falls within a range of 1000° to 1200° C.

* * * * *